US012588385B2

(12) United States Patent
Wei et al.

(10) Patent No.: US 12,588,385 B2
(45) Date of Patent: Mar. 24, 2026

(54) DISPLAY PANEL AND DEVICE WITH TOUCH LAYER METAL GRID AT PERIPHERIES OF PIXEL OPENINGS

(71) Applicants:Wuhan Tianma Micro-Electronics Co., Ltd., Wuhan (CN); Wuhan Tianma Micro-Electronics Co., Ltd. Shanghai Branch, Shanghai (CN)

(72) Inventors: Qibing Wei, Wuhan (CN); Peng Zhang, Wuhan (CN); Xingyao Zhou, Wuhan (CN); Qingxia Wang, Wuhan (CN)

(73) Assignees: Wuhan Tianma Micro-Electronics Co. Ltd., Wuhan (CN); Wuhan Tianma Micro-Electronics Co. Ltd. Shanghai Branch, Shanghai (CN)

( * ) Notice: Subject to any disclaimer, the term of this patent is extended or adjusted under 35 U.S.C. 154(b) by 325 days.

(21) Appl. No.: 18/204,700

(22) Filed: Jun. 1, 2023

(65) Prior Publication Data

US 2024/0315103 A1    Sep. 19, 2024

(30) Foreign Application Priority Data

Mar. 17, 2023    (CN) .......................... 202310277245.8

(51) Int. Cl.
*H10K 59/35*        (2023.01)
*G06F 3/044*        (2006.01)
*H10K 59/40*        (2023.01)
(52) U.S. Cl.
CPC ......... *H10K 59/353* (2023.02); *G06F 3/0446* (2019.05); *H10K 59/352* (2023.02); *H10K 59/40* (2023.02); *G06F 2203/04112* (2013.01)

(58) Field of Classification Search
CPC .... G06F 3/0446; G06F 3/0412; G06F 3/0443; H10K 59/353; H10K 59/352; H10K 59/40
See application file for complete search history.

(56) References Cited

U.S. PATENT DOCUMENTS

| | | | | |
|---|---|---|---|---|
| 2021/0405803 | A1* | 12/2021 | Ye ......................... | G06F 3/0446 |
| 2022/0093708 | A1 | 3/2022 | Cho et al. | |
| 2022/0197420 | A1* | 6/2022 | Choi .................... | G04G 17/045 |
| 2024/0053842 | A1* | 2/2024 | Zhang ................... | G06F 3/0445 |
| 2024/0188400 | A1* | 6/2024 | Liu ....................... | G06F 3/0448 |
| 2025/0107388 | A1* | 3/2025 | Sun ........................ | H10K 59/40 |

FOREIGN PATENT DOCUMENTS

| | | |
|---|---|---|
| CN | 111124189 A | 5/2020 |
| CN | 115686254 A | 2/2023 |

\* cited by examiner

*Primary Examiner* — Liliana Cerullo
(74) *Attorney, Agent, or Firm* — Anova Law Group, PLLC

(57) ABSTRACT

A display panel includes a display panel comprising a display layer and a touch layer arranged on a side of the display layer. The display layer includes a plurality of subpixels and a plurality of pixel openings. The plurality of subpixels includes first color subpixels and second color subpixels. The plurality of pixel openings includes first color pixel openings and second color pixel openings. A first color subpixel corresponds to a first color pixel opening. A second color subpixel corresponds to a second color pixel opening. An area of the first color pixel opening is larger than an area of the second color pixel opening. The touch layer includes a plurality of touch electrodes insulated from each other, and the plurality of touch electrodes includes a plurality of electrically connected metal grids.

18 Claims, 9 Drawing Sheets

<u>100</u>

1

DISPLAY PANEL AND DEVICE WITH TOUCH LAYER METAL GRID AT PERIPHERIES OF PIXEL OPENINGS

CROSS-REFERENCE TO RELATED APPLICATION

This application claims priority of Chinese Patent Application No. 202310277245.8, filed on Mar. 17, 2023, the entire contents of which are hereby incorporated by reference.

FIELD OF THE DISCLOSURE

The present disclosure generally relates to the field of display technology and, more particularly, relates to a display panel and a display device.

BACKGROUND

As an input medium, a touch screen is currently the simplest, most convenient, and natural way of human-computer interaction. With the development of display technology, more and more display panels integrate touch functions.

Touch screen technology detects a touched position (in the form of coordinates) and sends the position information to a CPU. The technology is activated when a finger, pen, or the like contacts a touch screen installed on the front of a display device, allowing input information to be determined. Currently, touch screens have a wide range of applications, including mobile terminals such as touch mobile phones and notebook computers, as well as human-machine display interfaces in the automation industry.

Introducing touch electrodes into the display device is usually necessary to enable a touch function of the display device. When the touch electrodes are made of metal grids, part of the metal grids are often visible at a large viewing angle during display, which affects a display effect.

BRIEF SUMMARY OF THE DISCLOSURE

One aspect of the present disclosure provides a display panel. The display panel includes a display panel comprising a display layer and a touch layer arranged on a side of the display layer. The display layer includes a plurality of subpixels and a plurality of pixel openings. The plurality of subpixels includes first color subpixels and second color subpixels. The plurality of pixel openings includes first color pixel openings and second color pixel openings. A first color subpixel corresponds to a first color pixel opening. A second color subpixel corresponds to a second color pixel opening. An area of the first color pixel opening is larger than an area of the second color pixel opening. The touch layer includes a plurality of touch electrodes insulated from each other. The plurality of touch electrodes includes a plurality of electrically connected metal grids. Disconnected parts are arranged between at least part of adjacent touch electrodes. The second color pixel openings include a plurality of first pixel openings arranged along a first direction, a first pixel opening of the plurality of first pixel openings includes a first edge and a second edge opposite along a second direction, and the first direction intersects the second direction. The first edges and the second edges are linear edges, an area between a line where the first edges are located and a line where the second edges are located is a first area, and the disconnected parts avoid the first area; or the first edges and the second edges are arc edges, a first tangent of the first edges and a second tangent of the second edges are parallel to the first direction, an area between the first tangent line and the second tangent line is a first area, and the disconnected parts avoid the first area.

Another aspect of the present disclosure provides a display device including a display panel. The display panel includes a display panel comprising a display layer and a touch layer arranged on a side of the display layer. The display layer includes a plurality of subpixels and a plurality of pixel openings. The plurality of subpixels includes first color subpixels and second color subpixels. The plurality of pixel openings includes first color pixel openings and second color pixel openings. A first color subpixel corresponds to a first color pixel opening. A second color subpixel corresponds to a second color pixel opening. An area of the first color pixel opening is larger than an area of the second color pixel opening. The touch layer includes a plurality of touch electrodes insulated from each other. The plurality of touch electrodes includes a plurality of electrically connected metal grids. Disconnected parts are arranged between at least part of adjacent touch electrodes. The second color pixel openings include a plurality of first pixel openings arranged along a first direction, a first pixel opening of the plurality of first pixel openings includes a first edge and a second edge opposite along a second direction, and the first direction intersects the second direction. The first edges and the second edges are linear edges, an area between a line where the first edges are located and a line where the second edges are located is a first area, and the disconnected parts avoid the first area; or the first edges and the second edges are arc edges, a first tangent of the first edges and a second tangent of the second edges are parallel to the first direction, an area between the first tangent line and the second tangent line is a first area, and the disconnected parts avoid the first area.

Other aspects of the present disclosure can be understood by a person skilled in the art in light of the description, the claims, and the drawings of the present disclosure.

BRIEF DESCRIPTION OF THE DRAWINGS

Accompanying drawings, which are incorporated into and constitute a part of the present specification, illustrate embodiments of the present disclosure and together with the description, serve to explain principles of the present disclosure.

DETAILED DESCRIPTION

Various exemplary embodiments of the present disclosure will be described in detail with reference to the accompanying drawings. It should be noted that, unless specifically stated otherwise, a relative arrangement of components and steps, numerical expressions and numerical values set forth in the embodiments do not limit the scope of the present disclosure.

The following description of at least one exemplary embodiment is merely illustrative and is not intended to limit the present disclosure and application or use thereof.

Techniques, methods, and apparatus known to a person skilled in the art may not be discussed in detail, but where appropriate, such techniques, methods, and apparatus should be considered as part of the present specification.

In all examples shown and discussed herein, any specific value should be construed as illustrative only and not as a limitation. Accordingly, other examples of exemplary embodiments may have different values.

It will be apparent to a person skilled in the art that various modifications and variations can be made in the present disclosure without departing from the spirit or scope of the present disclosure. Accordingly, the present disclosure is intended to cover the modifications and variations of the present disclosure that fall within the scope of corresponding claims (claimed technical solutions) and equivalents thereof. It should be noted that, implementations provided in the embodiments of the present disclosure may be combined with each other if there is no contradiction.

It should be noted that similar numerals and letters refer to similar items in the following accompanying drawings. Once an item is defined in one accompanying drawing, the item does not require further discussion in subsequent accompanying drawings.

Figure 1:
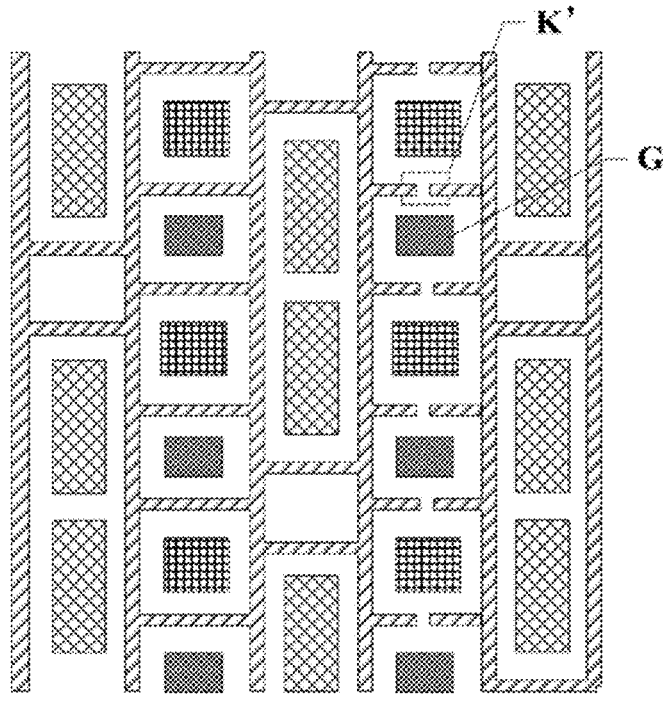
FIG. 1 illustrates a relative positional relationship between pixel openings and metal grids of touch electrodes.

FIG. 1 illustrates a relative positional relationship between pixel openings and metal grids of touch electrodes. The touch electrodes include metal grids, and adjacent touch electrodes are disconnected by disconnected parts K' of the metal grids. The disconnected parts K' are around a pixel opening corresponding to a green subpixel G with a smaller pixel opening area. The pixel opening area of a green subpixel is smaller, and a recognition of a green color by human eyes is more obvious. When an image is displayed, light emitted by the green subpixel can be emitted through the disconnected parts around the green subpixel. Therefore, there will be a problem that the metal grids can be seen at a large viewing angle at the disconnected part, which affects a display effect.

The present disclosure provides a display panel and a display device, aiming to improve a phenomena of visible metal grids at a large viewing angle due to light leakage from the disconnected parts of the metal grids.

Figure 2:
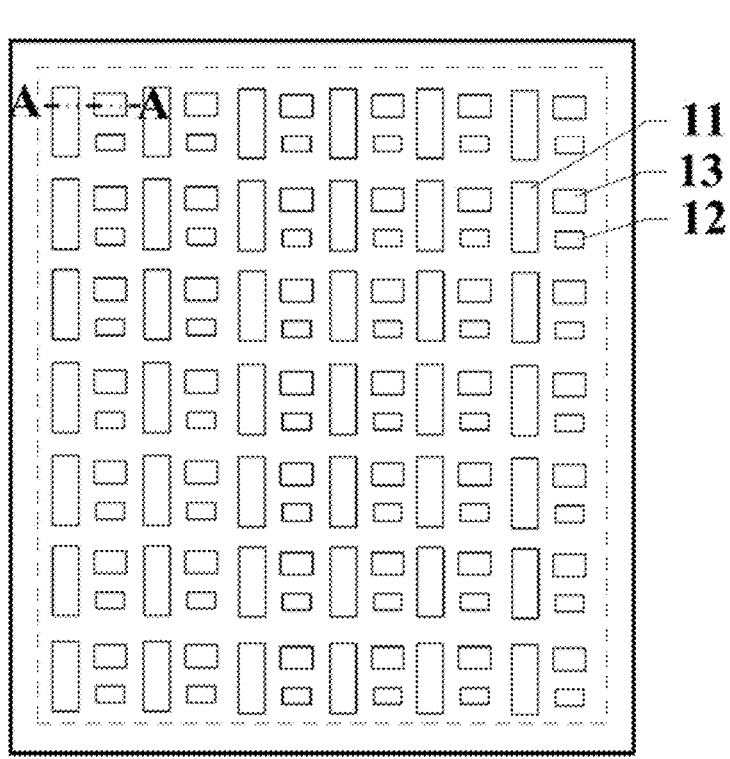
FIG. 2 illustrates a top view of a display panel consistent with various embodiments of the present disclosure.
Figure 3:
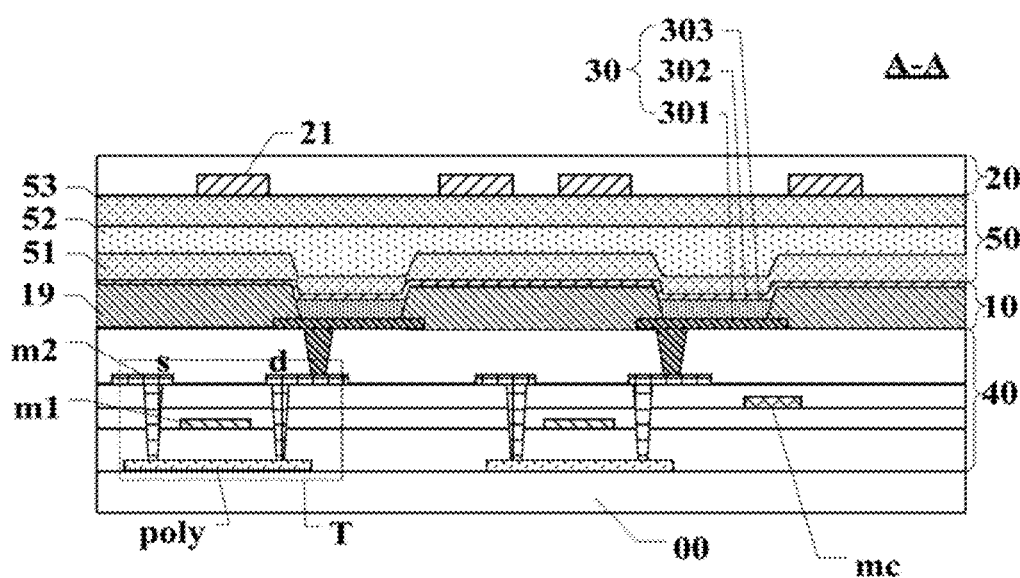
FIG. 3 illustrates an AA cross-sectional view of FIG. 2.
Figure 4:
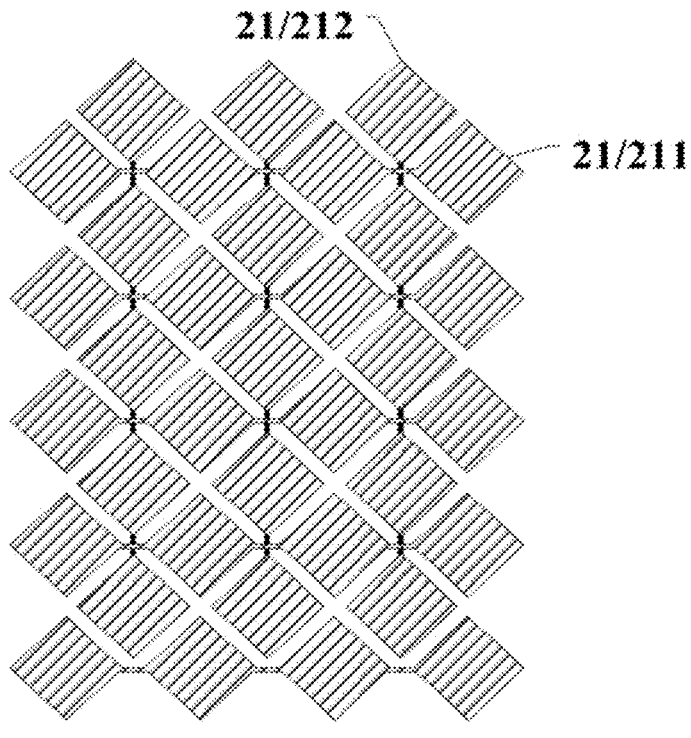
FIG. 4 illustrates a schematic diagram of an arrangement of touch electrodes in a touch layer consistent with various embodiments of the present disclosure.
Figure 5:
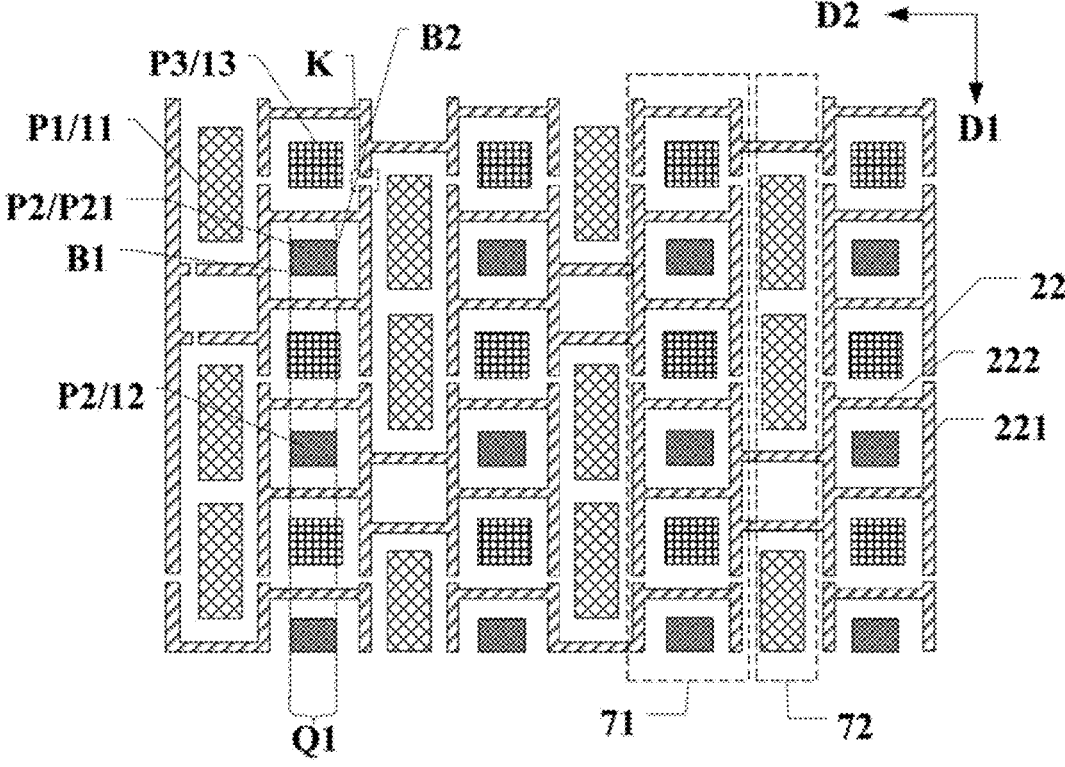
FIG. 5 illustrates a relative positional relationship between pixel openings corresponding to subpixels and metal grids of touch electrodes consistent with various embodiments of the present disclosure.
Figure 6:
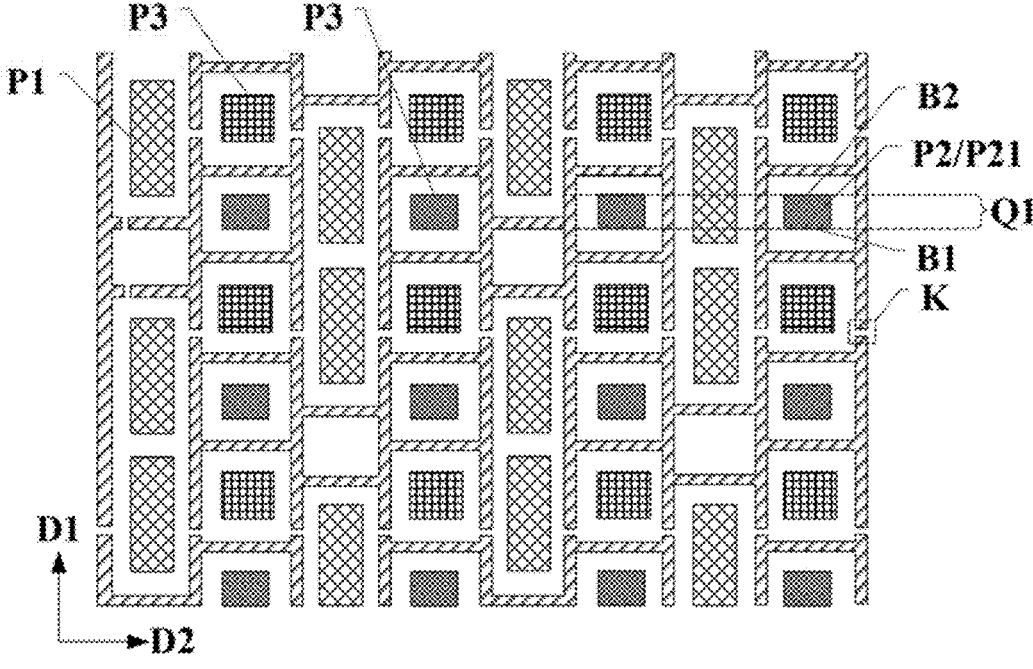
FIG. 6 illustrates another relative positional relationship between pixel openings corresponding to subpixels and metal grids of touch electrodes consistent with various embodiments of the present disclosure.
Figure 7:
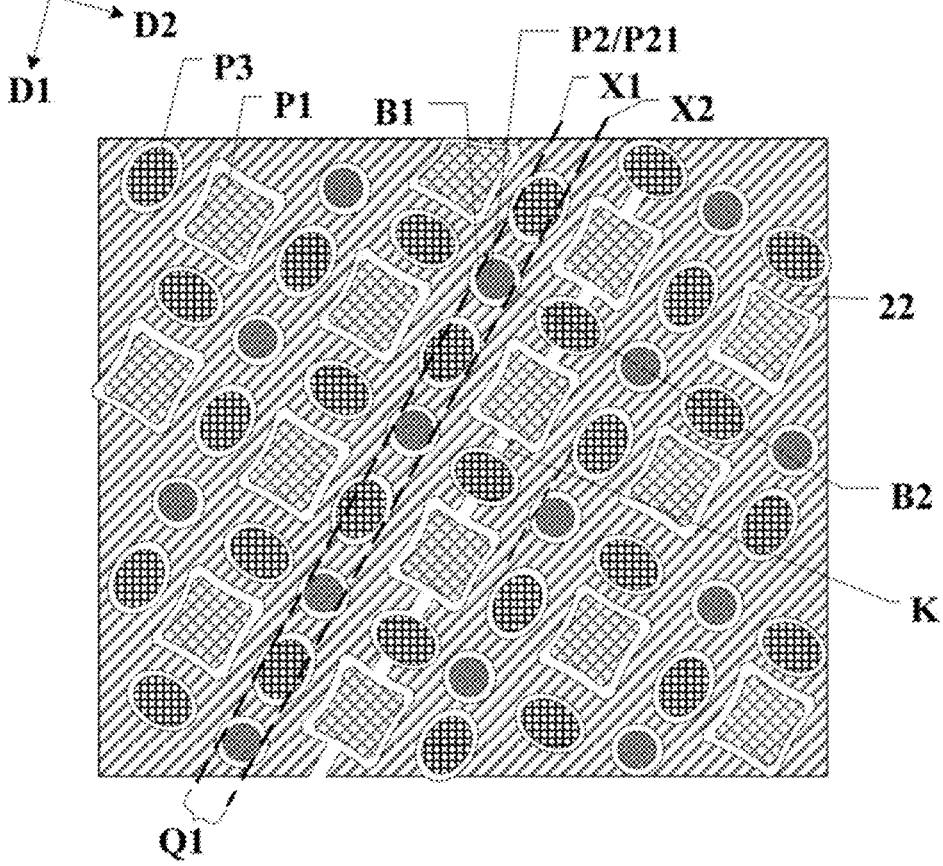
FIG. 7 illustrates another relative positional relationship between pixel openings corresponding to subpixels and metal grids of touch electrodes consistent with various embodiments of the present disclosure.

FIG. 2 illustrates a top view of a display panel consistent with various embodiments of the present disclosure. FIG. 3 illustrates an AA cross-sectional view of FIG. 2. FIG. 4 illustrates a schematic diagram of an arrangement of touch electrodes in a touch layer. FIG. 5 illustrates a relative positional relationship between pixel openings corresponding to subpixels and metal grids of touch electrodes consistent with various embodiments of the present disclosure. FIG. 6 illustrates another relative positional relationship between pixel openings corresponding to subpixels and metal grids of touch electrodes consistent with various embodiments of the present disclosure. FIG. 7 illustrates another relative positional relationship between pixel openings corresponding to subpixels and metal grids of touch electrodes consistent with various embodiments of the present disclosure.

Referring to FIGS. 2 to 5, in one embodiment, a display panel 100 includes a display layer 10 and a touch layer 20 arranged on a side of the display layer 10.

The display layer 10 includes a plurality of subpixels and a plurality of pixel openings. The plurality of subpixels includes first color subpixels 11 and second color subpixels 12. The plurality of pixel opening includes first color pixel openings P1 and second color pixel openings P2. A first color subpixel 11 corresponds to a first color pixel opening P1, and a second color subpixel 12 corresponds to a second color pixel opening P2. An area of the first color pixel opening P1 is larger than an area of the second color pixel opening P2.

The touch layer 20 includes a plurality of touch electrodes 21 insulated from each other. A touch electrode 21 includes a plurality of electrically connected metal grids 22. An orthographic projection of a metal grid 22 on a plane where the display panel is located is at a periphery of an orthographic projection of a pixel opening on the plane where the display panel is located. Disconnected parts K are arranged between at least part of adjacent touch electrodes 21. Optionally, metal grid 22 is a grid-like structure formed by intersections of a plurality of metal wires.

The second color pixel openings P2 include a plurality of first pixel openings P21 arranged along a first direction D1. A first pixel opening P21 includes a first edge B1 and a second edge B2 opposite to each other along a second direction D2, and the first direction D1 intersects the second direction D2. Optionally, the first direction D1 is perpendicular to the second direction D2.

First edges B1 and second edges B2 are straight edges, an area between a line where the first edges B1 are located and a line where the second edges B2 are located is a first area Q1, and the disconnected parts K avoid the first area Q1.

Alternatively, first edges B1 and second edges B2 are arc-shaped edges, and a first tangent X1 of the first edges B1 and a second tangent X2 of the second edges B2 are both parallel to the first direction. An area between the first tangent line X1 and the second tangent line X2 is the first area Q1, and the disconnected parts K avoid the first area Q1. That is, the disconnected parts K are not arranged in the first area Q1, but other areas outside the first area Q1.

Optionally, in one embodiment, the display panel may be a display panel using an organic light-emitting diode display technology (OLED), that is, an OLED display panel. A basic structure of a light-emitting functional layer of the OLED display panel includes an anode 301, a light-emitting material layer 302 and a cathode 303. When a power supplies an appropriate voltage, cavities in the anode 301 and electrons in the cathode 303 can combine in a luminescent material layer to generate bright light. Compared with thin-film field-effect transistor liquid crystal displays, OLED display devices have characteristics of high visibility and high brightness, and are more power-saving, lighter, and thinner. In some other embodiments, the display panel may also be a display panel using an inorganic light emitting diode display technology, such as a Micro LED display panel, or a Mini LED display panel, and the like.

FIG. 3 only uses an OLED display panel for illustration. Optionally, an encapsulation layer 50 is further arranged on a side of the cathode 303 away from the anode 301, and the display panel further includes a substrate 00 and a driving layer 40 arranged between the substrate and the display layer 10. The driving layer 40 contains a driving circuit that supplies voltage to the display layer 10 to emit light. Optionally, the driving layer 40 includes a first metal layer m1, a capacitor metal layer mc, and a second metal layer m2 arranged on the substrate 00. The first metal layer m1 can be, for example, a gate metal layer, and gates of transistors in the display panel can be arranged on the first metal layer m1. The capacitor metal layer mc is configured to form a capacitor structure with the first metal layer m1 or with the second metal layer m2. Source electrodes s and drain electrodes d of transistors T in the display panel can be on the second metal layer m2, the semiconductor layer poly includes a source region and a drain region, and the source drain regions are formed by doping either N-type impurity ions or P-type impurity ions. The source electrodes s of the transistors are electrically connected to the source region of the semiconductor layer poly through contact holes, and the drain electrodes d of the transistors are electrically connected to the drain region of the semiconductor layer poly through contact holes. Optionally, the encapsulation layer 50 is a thin-film layer, including a first inorganic layer 51, an organic layer 52 and a second inorganic layer 53 that work together to isolate water and oxygen and preventing external moisture and oxygen from affecting the luminescent material layer.

Optionally, the display layer 10 includes a pixel definition layer 19, including a plurality of pixel openings arranged through the pixel definition layer 19 along a thickness direction of the pixel definition layer 19. The luminescent material layer 302 is at least filled in the pixel openings. Optionally, the pixel openings corresponding to the first color subpixels 11 are filled with a first color luminescent material, and the pixel openings corresponding to the second color subpixels 12 are filled with a second color luminescent material. Along the thickness direction of the pixel definition layer 19, the anode 301 and the cathode 303 are respectively on two sides of the luminescent material layer. An area of a pixel opening refers to an overlapping area between the anode 301 and an opening of the pixel definition layer 19 as viewed from a direction perpendicular to the substrate 00. When the opening of the pixel definition layer 19 is embodied as an inverted trapezoidal structure as shown in FIG. 3, the area of a pixel opening refers to an area of a bottom that is adjacent to the anode. Optionally, a second color subpixel 12 is a green subpixel, an area of a pixel opening corresponding to the second color subpixel 12 is relatively small, and human eyes are more sensitive to green. Optionally, the first color subpixel 11 is one of a red subpixel and a blue subpixel. FIG. 5 illustrates one embodiment by taking the shape of an orthographic projection of a pixel opening on the plane where the display panel is located as a rectangle as an example. FIG. 7 illustrates one embodiment by taking the shape of an orthographic projection of a pixel opening on the plane where the display panel is located as a circle, ellipse or other non-rectangular special-shaped structure as an example. However, the actual shape of a pixel opening is not limited herein. In some other embodiments of the present disclosure, the shape of the orthographic projection of the pixel opening on the plane where the display panel is located may also take on other shapes.

The embodiments shown in FIG. 5 and FIG. 7 only illustrate two possible pixel arrangement structures in the display panel, but do not limit an actual pixel arrangement structure in the display panel.

Taking the embodiments shown in FIG. 5 and FIG. 7 as an example, the second color pixel openings P2 includes a plurality of first pixel openings P21 arranged along the first direction D1, and emission colors of the subpixels corresponding to the plurality of first pixel openings P21 are all the second color. A first pixel opening P21 includes a first edge B1 and a second edge B2 arranged opposite to each other along the second direction D2. The first edge B1 and the second edge B2 may be straight edges as shown in FIG. 5 or curved edges as shown in FIG. 7.

FIG. 4 is illustrated by taking touch electrodes 21 as an example of mutual capacitance touch electrodes. In some other embodiments, the touch electrodes 21 can also be embodied as self-capacitance structures, which are not specifically limited herein. Taking the mutual capacitive touch electrodes 21 as an example, the touch electrodes 21 include a plurality of first touch electrodes 211 arranged in a row direction and insulated, and a plurality of second touch electrodes 212 arranged in a column direction and insulated. The first touch electrodes 211 and the second touch electrodes 212 are insulated. Optionally, a first touch electrode 211 and a second touch electrode 212 both include a plurality of electrode blocks. Although not shown in the figures, each electrode block includes a metal grid as shown in FIG. 5 or FIG. 7, respectively. Optionally, an orthographic projection of an electrode block on the plane where the display panel is located corresponds to a plurality of pixel openings. Insulations are required between adjacent first touch electrodes 211 in the column direction, adjacent second touch electrodes 212 in the row direction, and between electrode blocks that are adjacent to both first touch electrodes 211 and second touch electrodes 212. In an actual formation, insulations may be realized by disconnecting metal grids at corresponding positions. In the related art, positions of disconnected parts easily cause the phenomena of visible metal grids. Therefore, the present disclosure improves positions of the disconnected parts of the metal grids.

Taking the embodiment shown in FIG. 5 as an example, first pixel openings P21 have rectangular structures, both the first edges B1 and the second edges B2 are straight edges, and the area between the line where the first edges B1 are located and the line where the second edges B2 are located is the first area Q1. If both the first edge B1 and the second edge B2 extend along the first direction D1, the disconnected parts are arranged avoiding the first area Q1. That is, the disconnected parts K are arranged in other areas outside the first area Q1. Along the first direction D1, the disconnected parts K do not overlap the second color pixel openings P2. Even though human eyes are more sensitive to second color light, light emitted by the second color subpixels may not be emitted from the disconnected parts or an amount of light emitted from the disconnected parts may be reduced, thereby avoiding or weakening the phenomena of visible metal grids at a large viewing angle caused by light leakage of the second color subpixels at positions of the disconnected parts, which is conducive to improving an overall display effect of the display panel.

In the embodiment shown in FIG. 5, the first pixel openings P21 include edges extending along the first direction D1 and edges extending along the second direction D2. The first direction D1 intersects the second direction D2. The embodiment shown in FIG. 5 is only described by taking the first edges B1 and the second edges B2 as edges extending along the first direction D1 as an example. The solution described in the present disclosure is also applicable when the first edge B1 and the second edge B2 extend along the second direction D2. Referring to FIG. 6, in one embodiment, the first edge B1 and the second edge B2 extend along the second direction D2, and an area defined by the two lines where the first edges B1 and the second edges B2 are located is the first area Q1. By arranging the disconnected parts K to avoid the first area Q1 along the second direction D2, the disconnected parts K do not overlap the second color pixel openings P2, which is also conducive to reducing or avoiding an emission of light from the disconnected parts K through the second color pixel openings P2 and improving an overall display effect of the display panel. In the display panel, if scan lines extend along the row direction, and data lines extend along the column direction, optionally, the second direction D2 in the embodiments shown in FIG. 5 and FIG. 6 is an extending direction of the scanning lines in the display panel, and the first direction D1 is an extending direction of the data lines in the display panel.

Taking the embodiment shown in FIG. 7 as an example, the first pixel openings P21 are arc-shaped structures, and the first edges B1 and the second edges B2 are both arc-shaped edges. The first edges B1 have a first tangent X1, the second edges B1 have a second tangent X2 parallel to the first tangent X1, and an area between the first tangent line X1 and the second tangent line X2 is the first area Q1. Arranging the disconnected parts K away from the first area Q1 is equivalent to arranging the disconnected parts K in other areas outside of Q1. Even though human eyes are more sensitive to second color light, reducing or avoiding an emission of light from the disconnected parts of the second color subpixels helps to avoid or weaken the visible metal grids at large viewing angles caused by light leakage of the second color subpixels from the disconnected parts, which improves an overall display effect of the display pane. Optionally, if scan lines in the display panel extend along the row direction, and data lines extend along the column direction, in the embodiment shown in FIG. 7, the first direction D1 intersects both extending directions of the scan lines and the data lines, while the second direction D2 intersects both extending directions of the scan lines and the data lines.

Figure 8:
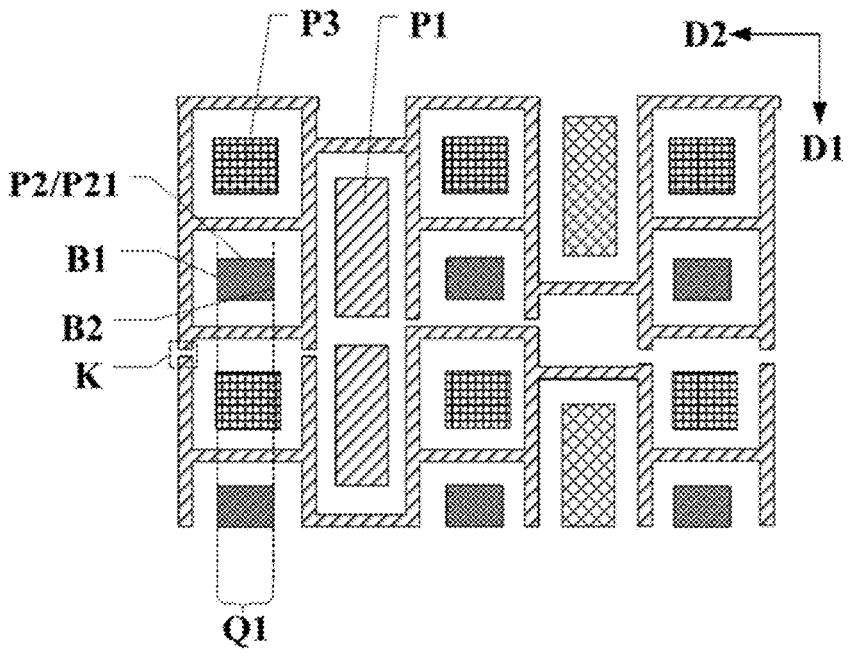
FIG. 8 illustrates another relative positional relationship between pixel openings corresponding to subpixels and metal grids of touch electrodes consistent with various embodiments of the present disclosure.

FIG. 8 illustrates another relative positional relationship between pixel openings corresponding to subpixels and metal grids of touch electrodes 21 consistent with various embodiments of the present disclosure. Referring to FIG. 2 and FIG. 8, in one optional embodiment, the subpixels also include third color subpixels 13, and the pixel openings also include third color pixel openings P3. A third color subpixel 13 corresponds to a third color pixel opening P3. An area of the third color pixel opening P3 is smaller than an area of the first color pixel opening P1, and greater than or equal to an area of the second color pixel opening P2. Along an extending direction of the first area Q1 (the embodiment takes the extending direction of the first area Q1 as the first direction D1 as an example for illustration), the disconnected parts K do not overlap the third color pixel openings P3, which is equivalent to placing the disconnected part as far away as possible from the third color pixel openings P3. Taking the embodiment shown in FIG. 8 as an example, along the first direction D1, the disconnected parts K do not overlap the first color pixel openings P1 and the third color pixel openings P3. Optionally, when the second color subpixels 12 are green subpixels, the first color subpixels 11 and the third color subpixels 13 are respectively one of red subpixels and blue subpixels. If scanning lines in the display panel extend along the row direction, and data lines extend along the column direction, optionally, in one embodiment shown in FIG. 8, the first direction D1 is the extending direction of the data lines in the display panel, and the second direction D2 is the extending direction of the scanning lines in the display panel.

When the subpixels also include third color subpixels 13, and an area of a pixel opening corresponding to a third color subpixel 13 is smaller than an area of a pixel opening corresponding to a first color subpixel 11, and greater than or equal to an area of a pixel opening corresponding to the second color subpixel 12. Human eyes are more sensitive to light emitted by the third color subpixel 13 but are insensitive to light emitted by the first color subpixel 11. When the disconnected parts are placed as far away from the third color pixel openings P3 as possible, light emitted from the third color pixel opening P3 does not exit from the disconnected parts, or an amount of light emitted by the third color pixel opening P3 from the disconnected parts is reduced, which is conducive to reducing the phenomenon of visible metal grids due to the light leakage of third color light.

It should be noted that, in the embodiment shown in FIG. 8, although part of the disconnected parts are arranged at upper left corners and upper right corners of the third color pixel openings P3, part of the disconnected parts are arranged at lower left corners and lower right corners of the first color pixel openings P1. In a direction parallel to the plane where the display panel is located, the disconnected parts are placed farther from centers of the pixel openings. Among light emitted from the pixel openings, light directed to the disconnected parts is relatively weak, which reduces light leakage at the positions of the disconnected parts and weaken or almost eliminate the phenomenon of visible metal grids at a large viewing angle.

Figure 9:
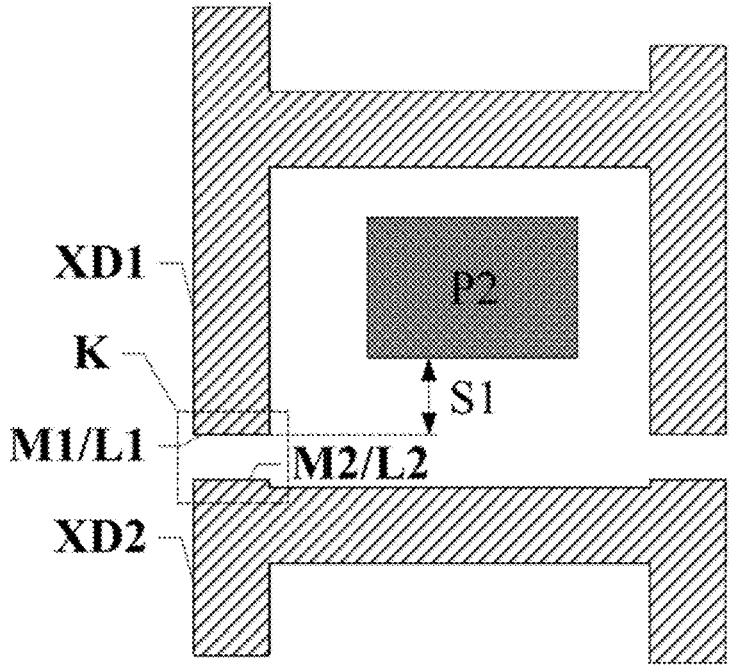
FIG. 9 illustrates a schematic diagram of a disconnected part of a metal grid of touch electrodes consistent with various embodiments of the present disclosure.

FIG. 9 illustrates a schematic diagram of a disconnected part of a metal grid of touch electrodes 21 consistent with various embodiments of the present disclosure. Referring to FIG. 4 and FIG. 9, in one optional embodiment, among adjacent touch electrodes, one touch electrode includes a first line segment XD1, the other touch electrode includes a second line segment XD2, a surface of the first line segment XD1 facing the second line segment XD2 is a first end face M1, and a surface of the second line segment XD2 facing the first line segment XD1 is a second end face M2, and a disconnected part K is between the first end face M1 and the second end face M2. The first end face M1 can be regarded as a surface opposite to the second line segment XD2 in the first line segment XD1, and the second end face M2 can be regarded as a surface opposite to the first line segment XD1 in the second line segment XD2. In the embodiment, only the top view structures of the first line segment XD1 and the second line segment XD2 on the plane where the display panel is located are shown, and the orthographic projections of the first end face M1 and the second end face M2 on the plane where the display panel is located are both represented as line segments.

When adjacent touch electrodes 21 are insulated by a disconnected part, if one of the touch electrodes includes the first line segment XD1 and the other touch electrode includes the second line segment XD2, the disconnected part is between the first line segment XD1 and the second line segment XD2. In an actual formation process, the first line segment XD1 and the second line segment XD2 are originally complete line segments connected, and the disconnected part K is formed on the complete line segments later and divides the complete line segments into the first line segment XD1 and the second line segment XD2 insulated from each other. An end face of the first line segment XD1 facing the second line segment XD2 is the first end face M1, and an end face of the second line segment XD2 facing the first line segment XD1 is the second end face M2. The disconnected part K can be regarded as an area between the first end face M1 and the second end face M2.

Referring to FIG. 9, in one optional embodiment, an orthographic projection of the first end face M1 on the plane where the display panel is located is a first straight line segment L1, and an orthographic projection of the second end face M2 on the plane where the display panel is located is a second straight line segment L2. The first straight line segment L1 and the second straight line segment L2 are parallel to each other, and respectively perpendicular to an extending direction of the first line segment XD1.

In the embodiment, after the disconnected part is formed, the orthographic projection of the first end face M1 corresponding to the first line segment XD1 on the plane where the display panel is located forms the first straight line segment L1, and the orthographic projection of the second end face M2 corresponding to the second line segment XD2 on the plane where the display panel is located forms the second straight line segment L2. The first straight line segment L1 and the second straight line segment L2 are parallel, and both are perpendicular to the extending direction of the first line segment XD1, so that the disconnected part K has a regular shape. The regular-shaped disconnected part K can be formed relatively easily, which is conducive to simplifying the forming process of the touch electrode 21 in the display panel and improving a production efficiency of the display panel.

Referring to FIG. 9, in one optional embodiment, Along the extending direction of the first line segment XD1, a minimum distance between the disconnected part K and an edge of an orthographic projection of a second color pixel opening P2 on the plane where the display panel is located is S1, and S1≥5.9 μm.

When the shape of the disconnected part K is a regular shape, the embodiment further limits the minimum distance S1 between the disconnected part K and the second color pixel opening P2. The minimum distance S1 refers to, along the extending direction of the first line segment XD1, a distance between one of the first straight line segment L1 and the second straight line segment L2 that is closer to the second color pixel opening P2 and an edge of the second color pixel opening P2 facing the disconnected part K in the orthographic projection of the plane where the display panel is located. The smaller the minimum distance, such that S1<5.9 μm, the greater the amount of light leaked from the disconnected part of light emitted by the second color subpixel is. When the display panel is viewed at a large viewing angle, the phenomenon of visible metal grids around the disconnected part is more obvious. Arranging the minimum distance to S1≥5.9 μm increases a distance between the second color pixel opening P2 and the disconnected part along the extending direction of the first line segment XD1. Among light emitted by the second color subpixel, an amount of light directed to the disconnected part is reduced accordingly, which is conducive to weakening the phenomenon of visible metal grids around the disconnected part and improve a display effect of the display panel.

Since human eyes are more sensitive to the second color, when the disconnected part is arranged around the second color pixel opening P2, the minimum distance S1 between the second color subpixel opening and the disconnected part is given priority to ensure that the minimum distance S1≥5.9 μm, thereby weakening the phenomena of visible metal grids caused by a sensitivity of human eyes to second color light emitted from the disconnected part.

In some other embodiments, if the disconnected part is arranged around the third color pixel opening, a minimum distance between the third color pixel opening and the disconnected part can also meet the distance requirement described above, which is equivalent to replacing the second color pixel opening with the third color pixel opening based on the embodiment shown in FIG. 9, thereby weakening the phenomena of visible metal grids due to light leakage from the third color subpixel at a position of the disconnected part.

Figure 10:
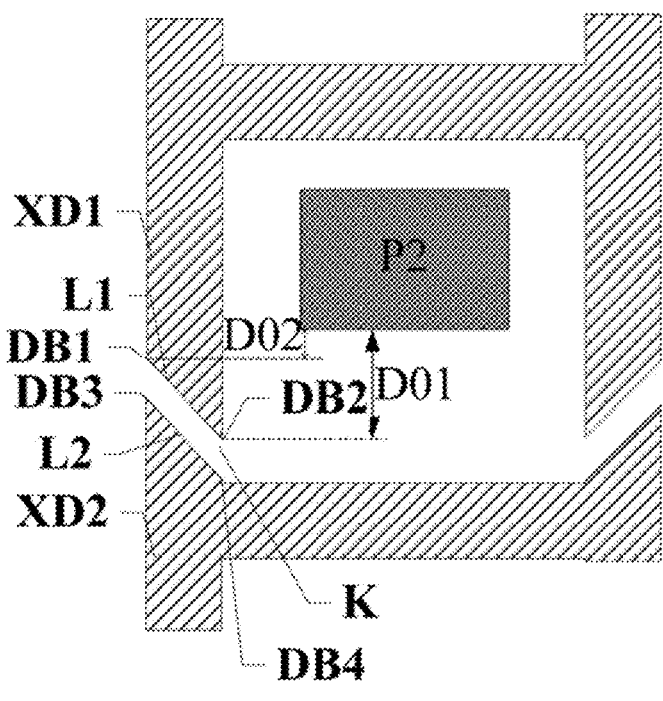
FIG. 10 illustrates another schematic diagram of a disconnected part of a metal grid of touch electrodes consistent with various embodiments of the present disclosure.

FIG. 10 illustrates another schematic diagram of a disconnected part of a metal grid of touch electrodes 21 consistent with various embodiments of the present disclosure. In one embodiment, another implementation is provided for the first straight line segment L1 and the second straight line segment L2, which correspond to the first line segment XD1 and the second line segment XD2.

Referring to FIG. 10, in one optional embodiment, the orthographic projection of the first end face M1 on the plane where the display panel is located is the first straight line segment L1, and the orthographic projection of the second end face M2 on the plane where the display panel is located is the second straight line segment L2. The first straight line segment L1 and the second straight line segment L2 are parallel to each other, and the extending direction of the first line segment L1 intersects the first line segment XD1 at an angle that is not perpendicular.

In the embodiment, the first straight line segment L1 corresponding to the first end face M1 of the first line segment XD1 and the second straight line segment L2 corresponding to the second end face M2 of the second line segment XD2 are still parallel structures. The first straight line segment L1 is inclined relative to an extending direction of the first line segment XD1, and at the same time, the second straight line segment L2 is inclined relative to the extending direction of the first line segment XD1. That is, the extending direction of the first line segment L1 intersects the first line segment XD1 at an angle that is not perpendicular. The disconnected part is in the shape of an elongated strip arranged obliquely. In the embodiment, along a direction of the first line segment XD1 pointing to the second color pixel opening P2, the disconnected part K does not overlap the second color subpixel opening, which is equivalent to avoiding an area where a light output of the second color subpixel is relatively large. The disconnected part is placed in the area where the light output of the second color subpixel is small, to reduce the phenomena of visible metal grids at a large viewing angle when light is emitted from the disconnected part.

Referring to FIG. 10, in one optional embodiment, orthographic projections of the first line segment XD1 and the second line segment XD2 on the plane where the display panel is located are adjacent to the orthographic projection of the second color pixel opening P2 on the plane where the display panel is located. Along the extending direction of the first line segment XD1, the first line segment L1 is between the second line segment L2 and the second color pixel opening P2. The first straight line segment L1 includes a first end portion DB1 and a second end portion DB2 opposite to each other. Along the extending direction of the first line segment XD1, the first end portion DB1 is between the second end portion DB2 and the second color pixel opening P2. Along an arrangement direction of the first line segment XD1 and the second color pixel opening P2, the second end portion DB2 is between the first end portion DB1 and the second color pixel opening P2.

Referring to FIG. 10, along the extending direction of the first line segment XD1, the first line segment L1 is between the second line segment L2 and the second color pixel opening P2, that is, the first line segment L1 is closer to the second color pixel opening P2 than the second straight line segment L2. The first straight line segment L1 includes the first end portion DB1 and the second end portion DB2. Along the direction of the first line segment XD1 pointing to the second color pixel opening P2, the second end portion DB2 is between the first end portion DB1 and the second color pixel opening P2. The first straight line segment can be considered to originate from the first end DB1 and formed by rotating a certain angle clockwise from a position parallel to the X-axis direction, and the angle is greater than 0° and less than 90°. When the first straight line segment L1 rotates clockwise from the direction parallel to the X axis, as the rotation angle increases, the second end DB2 of the first straight line segment L1 is farther away from the second color pixel opening P2, an amount of light emitted by the second color subpixel to the disconnected part gradually decreases, and the phenomenon of visible metal grids at a corresponding position of the disconnected part become weaker and weaker, which is more conducive to improving a visibility of metal grids at a large viewing angle.

When the first straight line segment L1 is rotated clockwise in the above manner, along the extending direction of the first line segment XD1, if a distance between the first end DB1 of the first straight line segment L1 and a lower edge of the second color pixel opening P2 is D02, and a distance between the second end DB2 of the first straight line segment L1 and the lower edge of the second color pixel opening P2 is D01, then D01>D02. That is, the second end portion DB2 of the first straight line segment L1 is farther away from the second color pixel opening P2 than the first end portion DB1. If the second straight line segment L2 also includes a third end portion DB3 and a fourth end portion DB4, along the direction of the first straight line segment L1 pointing to the second color pixel opening P2, the fourth end portion DB4 of the second straight line segment L2 is between the third end portion DB3 of the second straight line segment L2 and the second color pixel opening P2. Since the first straight line segment L1 is parallel to the second straight line segment L2, the fourth end portion DB4 of the second straight line segment L2 is farther away from the second color pixel opening P2 than the third end portion DB3 of the second straight line segment L2. An area between the first end portion DB1 of the first straight line segment L1 and the third end portion DB3 of the second straight line segment L2 can be regarded as a first opening of the disconnected part. An area between the second end portion DB2 of the first straight line segment L1 and the fourth end portion DB4 of the second straight line segment L2 can be regarded as a second opening of the disconnected part. Along the extending direction of the first line segment XD1, the second opening is farther away from the second color pixel opening P2 than the first opening. When light emitted by the second color subpixel is emitted through the disconnected part, the light first passes through the second opening. The second opening is farther away from the second color pixel opening P2, and the light emitted through the second opening is less, thereby effectively reducing the phenomena of visible metal grids at a large viewing angle caused by light leakage from the disconnected part.

It should be noted that the embodiment in FIG. 10 only serves as an example to illustrate a structure of the disconnected part when the disconnected part is placed on a periphery of the second color pixel opening. When the disconnected part is arranged in the third color pixel opening or a periphery of the first color pixel opening, the shape of the disconnected part can also adopt the shape of the disconnected part shown in FIG. 10, which is not specifically limited herein.

Figure 11:
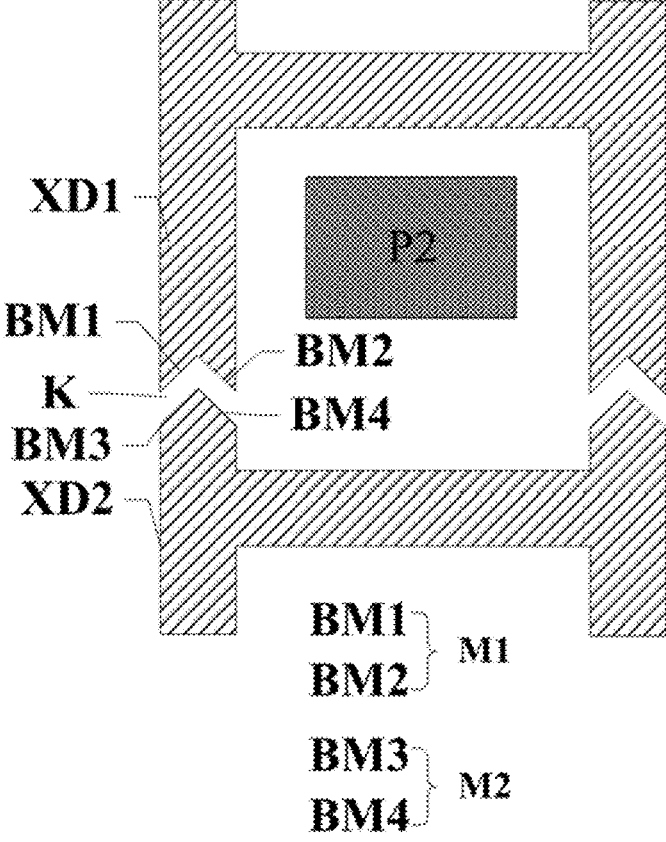
FIG. 11 illustrates another schematic diagram of a disconnected part of a metal grid of touch electrodes consistent with various embodiments of the present disclosure.

FIG. 11 illustrates another schematic diagram of a disconnected part of a metal grid of touch electrodes 21 consistent with various embodiments of the present disclosure. In one embodiment, the disconnected part is a special-shaped structure.

Referring to FIG. 11, in one optional embodiment, the first end face M1 includes a first subsurface BM1 and a second subsurface BM2 that are connected. The second end face M2 includes a third subsurface BM3 and a fourth subsurface BM4 that are connected. The first subsurface BM1 is oppositely configured to the third subsurface BM3, and the second subsurface BM2 is opposite to the fourth subsurface BM4.

Specifically, the first end face M1 and the second end face M2 of the first line segment XD1 in the embodiment are not planar structures. The first end face M1 includes the first subsurface BM1 and the second subsurface BM2 that are connected, and orthographic projections of the first subsurface BM1 and the second subsurface BM2 on the plane where the display panel is located are sharp-angled. The second end face M2 includes the third subsurface BM3 and the fourth subsurface BM4 that are connected, and orthographic projections of the third subsurface BM3 and the fourth subsurface BM4 on the plane where the display panel is located are also sharp-angled. The first subsurface BM1 and the third subsurface BM3 face each other to form a light exit channel, and the second subsurface BM2 and the fourth subsurface BM4 face each other to form another light exit channel. When light emitted by the second color subpixels is emitted through the disconnected part, the light needs to pass through the above two light exit channels. Compared to an approach where an extending direction of a light exit channel is perpendicular to the first line segment XD1, the embodiment utilizes two light exit channels to increase transmission paths of light and reduce light attenuation during a transmission process. Emitting light through the two light exit channels causes a reduction in an amount of emitted light, which is also conducive to reducing the phenomena of visible metal grids due to light leakage at the position of the disconnected part.

Referring to FIG. 11, in one optional embodiment, a plane where the first subsurface BM1 is located intersects a plane where the second subsurface BM2 is located, a plane where the third subsurface BM3 is located intersects a plane where the fourth subsurface BM4 is located, the first subsurface BM1 is parallel to the third subsurface BM3, and/or the second subsurface BM2 is parallel to the fourth subsurface BM4.

The embodiment shown in FIG. 11 shows a scheme that the first subsurface BM1 is parallel to the third subsurface BM3, and the second subsurface BM2 is parallel to the fourth subsurface BM4. The arrangement of having two sub-surfaces parallel to each other simplifies the forming process of the disconnected part K. In some other embodiments, the first subsurface BM1 is parallel to the third subsurface BM3, and an extending direction of the second subsurface BM2 intersects an extending direction of the fourth subsurface BM4. Alternatively, an extending direction of the first subsurface BM1 intersects an extending direction of the third subsurface BM3, and the second subsurface BM2 is parallel to the fourth subsurface BM4. The above arrangement methods are all conducive to prolonging transmission paths of light emitted by a subpixel in the disconnected part, reducing an amount of light emitted through the disconnected part, and improving the phenomena of visible metal grids.

Figure 12:
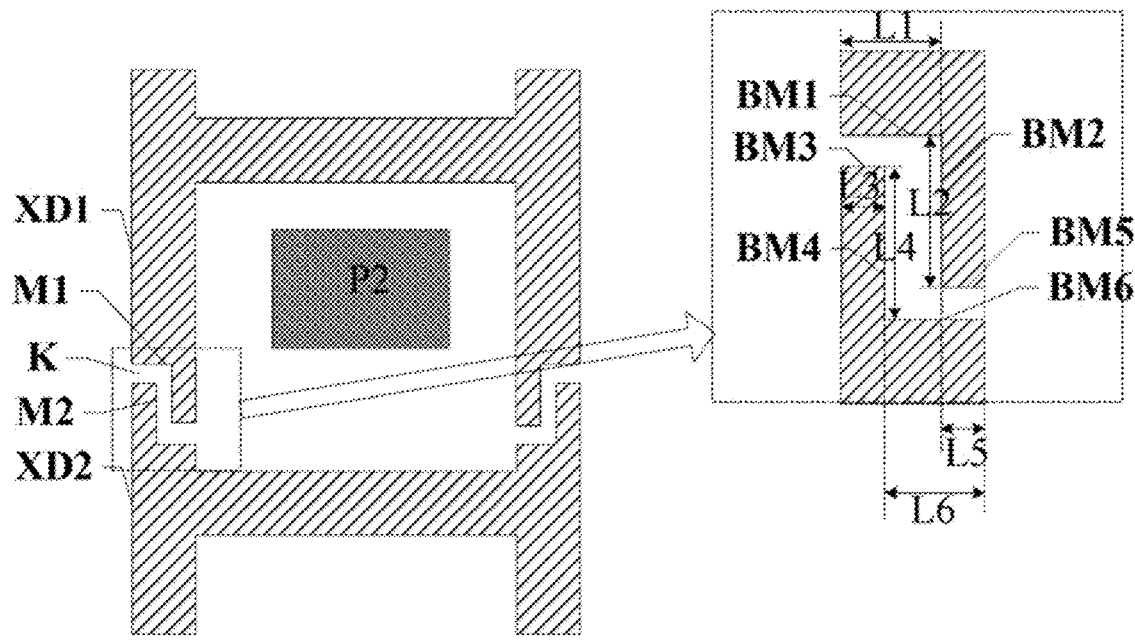
FIG. 12 illustrates another schematic diagram of a disconnected part of a metal grid of touch electrodes consistent with various embodiments of the present disclosure.

FIG. 12 illustrates another schematic diagram of a disconnected part of a metal grid of touch electrodes 21 consistent with various embodiments of the present disclosure. In one embodiment, both the first end portion of the first line segment XD1 and the second end portion of the second line segment XD2 include three sub-surfaces.

Referring to FIG. 12, in one optional embodiment, the first end face M1 also includes a fifth subsurface BM5 connected to the second subsurface BM2, the second end face M2 also includes a sixth subsurface BM6 connected to the fourth subsurface BM4, the fifth subsurface BM5 is opposite to the sixth subsurface BM6.

Specifically, in the embodiment, orthographic projections of the first subsurface BM1, the second subsurface BM2, and the fifth subsurface BM5 corresponding to the first end face M1 on the plane where the display panel is located are three straight line segments. The three straight line segments are connected in pairs to form a Z-like shape. Orthographic projections of the third subsurface BM3, the fourth subsurface BM4 and the sixth subsurface BM6 on the plane where the display panel is located corresponding to the second end face M2 are also three straight line segments. The three straight line segments are also connected in pairs to form a Z-like shape. The first subsurface BM1 is opposite to the third subsurface BM3 to form a channel, the second subsurface BM2 is opposite to the fourth subsurface BM4 to form another channel, and the fifth subsurface BM5 is opposite to the sixth subsurface BM6 to form another channel. When light of a subpixel is emitted through the disconnected part, the light needs to go through the above three channels, which further prolongs transmission paths of the light, and is more conducive to reducing an amount of light emitted from the disconnected part and weakening or eliminating the problem of visible metal grids.

Optionally, the first subsurface BM1 is parallel to the third subsurface BM3, the second subsurface BM2 is parallel to the fourth subsurface BM4, and the fifth subsurface BM5 is parallel to the sixth subsurface BM6, to simplify a formation process of the disconnected part.

Optionally, the first subsurface BM1 and the fifth subsurface BM5 are respectively perpendicular to the second subsurface BM2, and the third subsurface BM3 and the sixth subsurface BM6 are respectively perpendicular to the fourth subsurface BM4.

It should be noted that the embodiment is only described by taking a scheme in which extending directions of the straight line segments formed by the orthographic projection of the six sub-surfaces on the display panel are parallel or perpendicular to the extending direction of the first line segment XD1. In some other embodiments, the straight line segments formed by the orthographic projection of at least part of the sub-surfaces on the display panel may also be inclined relative to the extending direction of the first line segment XD1. For example, the straight line segments intersect the extending direction of the first line segment XD1 at an angle that is not perpendicular.

Referring to FIG. 12, in one optional embodiment, a length L2 of the line segment corresponding to an orthographic projection of the second subsurface BM2 on the plane where the display panel is located is greater than a length L1 of the line segment corresponding to an orthographic projection of the first subsurface BM1 on the plane where the display panel is located, and/or is greater than a length L5 of the line segment corresponding to an orthographic projection of the fifth subsurface BM5 on the plane where the display panel is located. A length L4 of the line segment corresponding to an orthographic projection of the fourth subsurface BM4 on the plane where the display panel is located is greater than a length L3 of the line segment corresponding to an orthographic projection of the third subsurface BM3 on the plane where the display panel is located, and/or is greater than a length L6 of the line segment corresponding to an orthographic projection of the sixth subsurface BM6 on the plane where the display panel is located.

In the embodiment, it is assumed that a first channel is formed by a relative arrangement of the first subsurface BM1 and the third subsurface BM3, a second channel is formed by a relative arrangement of the second subsurface BM2 and the fourth subsurface BM4 is, and a third channel is formed by the opposing arrangement of the fifth subsurface BM5 and the sixth subsurface BM6. The second channel communicates with the first channel and the third channel respectively, and an extending direction of the second channel intersects an extending direction of the first channel and the third channel. When light emitted by a subpixel is emitted to the disconnected part, the light passes through the third channel, the second channel and the first channel in sequence, and exits. Since lengths of the first channel and the second channel are limited by line widths of the first line segment XD1 and the second line segment XD2, the lengths are not made longer. When the extending direction of the second channel is same as the extending direction of the first line segment XD1, the length of the second channel is not limited by the line width of the first line segment XD1. Therefore, the length of the second channel can be arranged relatively large, for example, greater than the lengths of the first channel and the third channel. Increasing the length of the second channel can increase transmission paths of the light at the disconnected part. Longer transmission paths result in greater optical loss and less light emitted from the disconnected part, which is more conducive to reducing the problem of light leakage at a large viewing angle caused by the light leakage of the disconnected part.

It should be noted that FIG. 12 is described only by taking a buckle-like structure around the second color pixel opening P2 as an example. When the disconnected part is arranged at other position, the structure shown in FIG. 12 can also be adopted, which is not specially limited herein.

In the above embodiment, the orthographic projections of the first end face M1 of the first line segment XD1 and the second end face M2 of the second line segment XD2 on the plane where the display panel is located are single straight line segments or polyline segments formed two or more straight line segments. In some other embodiments, shapes of the orthographic projections of the first end face M1 of the first line segment XD1 and the second end face M2 of the second line segment XD2 on the plane where the display panel is located can also be represented as arc line segments as shown in FIG. 13.

Figure 13:
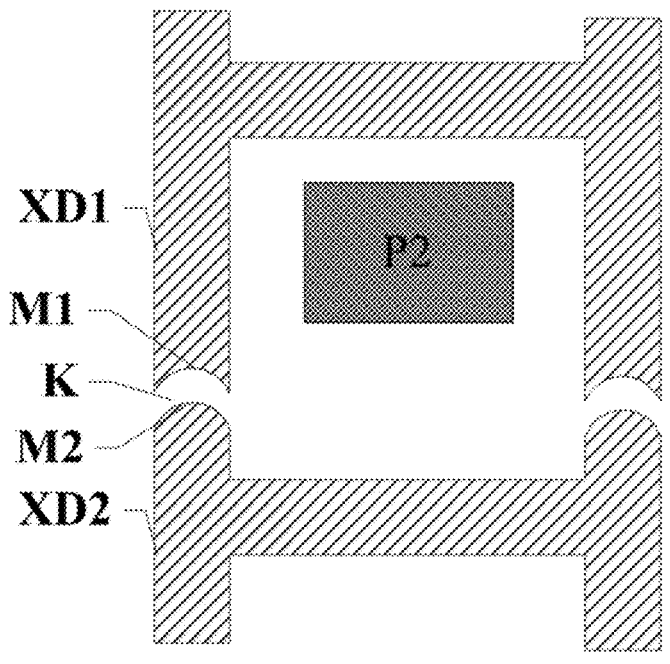
FIG. 13 illustrates another schematic diagram of a disconnected part of a metal grid of touch electrodes consistent with various embodiments of the present disclosure.

FIG. 13 illustrates another schematic diagram of a disconnected part of a metal grid of touch electrodes 21 consistent with various embodiments of the present disclosure. In one optional embodiment, the first end face M1 includes a first arc-shaped surface, and a projection of the first arc-shaped surface on the plane where the display panel is located is a first arc-shaped segment. The second end face M2 includes a second arc-shaped surface, and a projection of the second arc-shaped surface on the plane where the display panel is located is a second arc-shaped segment. The first arc-shaped surface includes a first protrusion, the second arc-shaped surface includes a second recess, and shapes of the first protrusion and the second recess are fitted, that is, shapes of the first arc segment and the second arc segment are fitted.

When the orthographic projections of the first end face M1 and the second end face M2 on the display panel are both arc-shaped line segments, the shapes of the first arc-shaped line segment and the second arc-shaped line segment are fitted. Taking the embodiment shown in FIG. 13 as an example, fitting means that the first arc segment and the second arc segment bend in the same direction. For example, both the first arc line segment and the second arc line segment bend along a direction in which the second line segment XD2 points to the first line segment XD1. The first arc line segment and the second arc line segment form a curved light guide channel. Compared with a light guide channel whose extending direction is perpendicular to a line segment, the curved light guide channel is conducive to increasing a transmission distance of light in the disconnected part, reduce an amount of light emitted from the disconnected part and reduce the problem of visible metal grids.

Referring to FIG. 5, in one optional embodiment, the display panel includes first pixel columns 71 and second pixel columns 72 alternately arranged along the second direction D2. A first pixel column 71 includes a plurality of second color subpixels 12 and a plurality of third color subpixels 13 alternately arranged along the first direction D1. A second pixel column 72 includes a plurality of first color subpixels 11 arranged along a first direction D1. The first direction D1 is a column direction, and the second direction D2 is a row direction.

Specifically, in one embodiment, FIG. 5 illustrates a pixel arrangement structure of the display panel. In the pixel arrangement structure, the second color subpixels 12 and the third color subpixels 13 in the first pixel column 71 are alternately arranged along the first direction D1, and the first color subpixels 11 in the second pixel column 72 are arranged along the first direction D1. An area of a pixel opening corresponding to a first color subpixel 11 is larger than an area of a pixel opening corresponding to a second color subpixel 12 and larger than an area of a pixel opening corresponding to a third color subpixel 13. In the embodiment, the arrangement structure of pixels is simple, an orthographic projection of each pixel opening on the display panel is a square structure, and a forming process is relatively simple.

In one optional embodiment, the metal grid 22 includes first metal line segments 221 and second metal line segments 222, the first metal line segments 221 extend along the first direction D1, and the second metal line segments 222 extends along the second direction D2. When a pixel arrangement adopts the structure shown in FIG. 5, extending directions of metal line segments in the metal grid can conform to both extending directions of edges of the pixel opening of a subpixel, and arrangement directions of pixel rows and subpixels in the pixel rows, which is conducive to simplifying a forming process of the metal grids and improve a production efficiency of the display panel.

Figure 14:
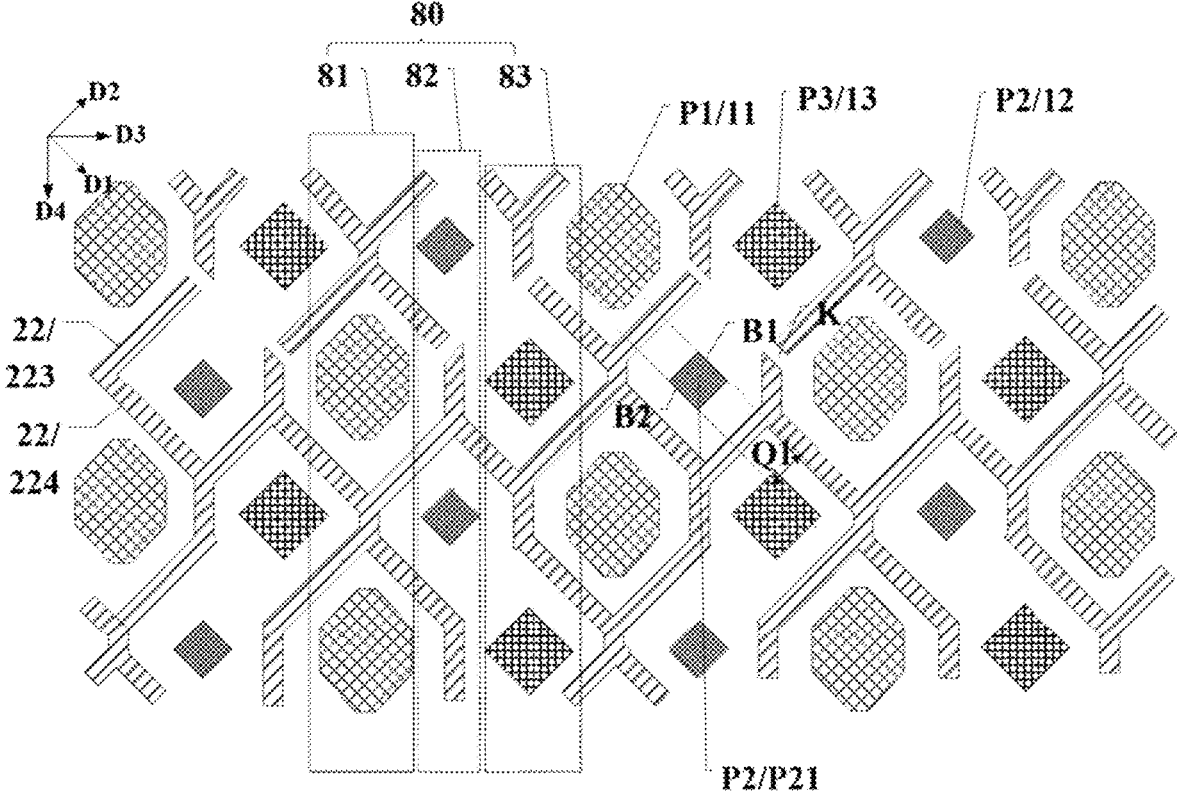
FIG. 14 illustrates another relative positional relationship between pixel openings corresponding to subpixels and metal grids of touch electrodes consistent with various embodiments of the present disclosure.

FIG. 14 illustrates another relative positional relationship between pixel openings corresponding to subpixels and metal grids of touch electrodes 21 consistent with various embodiments of the present disclosure.

Referring to FIG. 14, in one optional embodiment, the display panel includes a plurality of pixel column units 80 arranged along a third direction D3. The plurality of pixel column units 80 includes a first pixel column 81, a second pixel column 82 and a third pixel column 83 arranged in sequence along the third direction D3. The first pixel row 81 includes a plurality of first color subpixels 11 arranged along a fourth direction D4, the second pixel row 82 includes a plurality of second color subpixels 12 arranged along the fourth direction D4, and the third pixel row 83 includes a plurality of third color subpixels 13 arranged along the fourth direction D4. The third direction D3 intersects the first direction D1, the second direction D2 and the fourth direction D4, and the fourth direction D4 intersects both the first direction D1 and the second direction D2. In a same pixel column unit 80, the first color subpixels 11 and the third color subpixels 13 are in a same row along the third direction D3, and the second color subpixels 12 are in another row. Optionally, when the second color subpixels 12 are green subpixels, the first color subpixels 11 and the third color subpixels 13 are respectively one of red subpixels and blue subpixels. Optionally, in one embodiment, the third direction D3 is a row direction, and the fourth direction D4 is a column direction. If scan lines in the display panel extend along the row direction and data lines extend along a column direction, in the embodiment shown in FIG. 14, the third direction D3 is an extending direction of the scan lines in the display panel, The fourth direction D4 is an extending direction of the data lines in the display panel, the first direction D1 is a direction intersecting both extending directions of the scanning lines and the data lines in the display panel, and the second direction D2 is a direction intersecting both extending directions of the scan lines and the data lines in the display panel.

Specifically, the embodiment shows another feasible pixel arrangement structure. In the pixel column units 80 included in the display panel, the first pixel column 81, the second pixel column 82 and the third pixel column 83 all only include subpixels of a single color, and subpixels corresponding to different pixel columns have different colors. Along the fourth direction D4, the subpixels in the second pixel row 82 are arranged in dislocation with the subpixels in the first pixel row 81 and are arranged in a dislocation with the subpixels in the third pixel row 83. For example, along the fourth direction D4, a second color subpixel 12 is between two adjacent first color subpixels 11 and is also between two adjacent third color subpixels 13. The above type of pixel arrangement structure is also configured for positioning disconnections in the embodiment. Taking a first pixel opening P21 in FIG. 14 as an example, an area between a line where the first edge B1 of the first pixel openings P21 are located and a line where the second edge B2 are located is the first area Q1, and the disconnected part K is in the first area Q1. Therefore, along an extending direction of the first edge B1, the disconnected part K does not overlap the second color pixel opening P2, and light emitted by the second color subpixel 12 emit less light from the disconnected part, thereby weakening a problem that the second color subpixel 12 leaks light at the disconnected part and causes the metal grid to be visible at a large viewing angle, which is conducive to improving an overall display effect of the display panel adopting the pixel arrangement structure shown in FIG. 14.

Referring to FIG. 14, in one optional embodiment, the metal grid 22 includes a first metal line segment 223 and a second metal line segment 224, the first metal line segment 223 extends along the second direction D2, and the second metal line segment 224 extends along the first direction D1.

In the embodiment, the first color pixel opening P1, the second color pixel opening P2 and the third color pixel opening P3 all include edges extending along the first direction D1 and edges extending along the second direction D2. When the metal grid-shaped touch electrodes 21 are formed around the pixel openings, the first metal line segment 223 in the metal grid is extended along the second direction D2, the second metal line segment 224 extends along the first direction D1, which is equivalent to wiring orthographic projections of at least part of the metal line segments in the metal grid on the plane where the display panel is located along edge peripheries of the corresponding pixel openings, which is conducive to reducing a process of forming the touch electrodes 21 and improve a production efficiency of the display panel.

It should be noted that the pixel arrangement structures shown in the embodiment of the present disclosure are only for illustration and do not limit actual pixel arrangement structures of the display panel in the present disclosure. The arrangement of the disconnected part of the present disclosure is also applicable to other types of pixel structures.

The embodiments shown in FIG. 5, FIG. 8 and FIG. 14 are described by taking edges of the pixel openings as straight line segments and the line segments included in the metal grids as straight line segments as an example. The metal grids are wired along peripheries of the pixel openings. In some other embodiments, the shapes of the orthographic projections of the pixel openings and the metal grids in the display panel can also be embodied as other shapes. When the pixel openings include arc line segments, the corresponding metal grids may also include arc line segments. Referring to FIG. 7, in one optional embodiment, the metal grids 22 include arc segments.

When the shapes of the pixel openings include arc line segments, the line segments of the metal grids corresponding to the peripheries of the pixel openings are also arranged with arc line segments, which is conducive to simplifying a forming process of the touch electrodes and preventing touch electrodes from blocking pixel openings.

Figure 15:
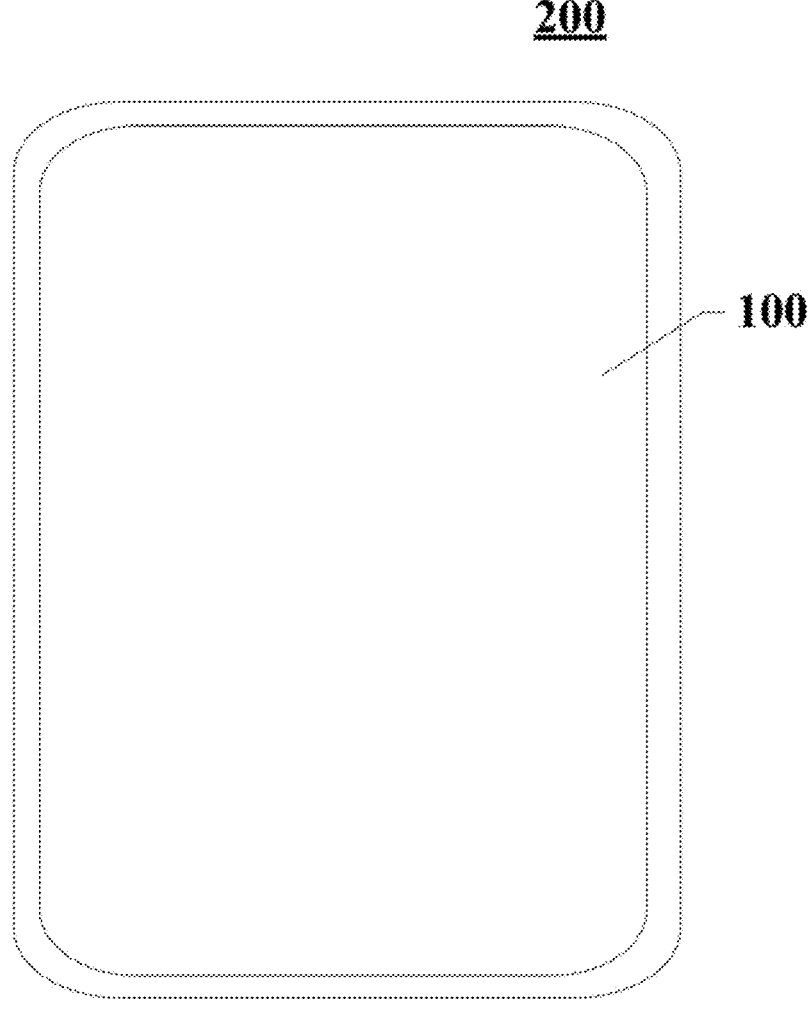
FIG. 15 illustrates a top view of a display device consistent with various embodiments of the present disclosure.

Based on a same inventive concept, the present disclosure also provides a display device. FIG. 15 illustrates a top view of a display device consistent with various embodiments of the present disclosure. The display panel includes the display panel provided by any one of the above embodiments.

It can be understood that the display device provided by the embodiment may be a mobile phone, a tablet, a computer, a TV, a vehicle display device and other display device with display and touch functions, which is not specially limited herein. The display device provided by the embodiment has the beneficial effects of the display panel provided by any one of the above embodiments. For details, reference may be made to the specific descriptions of the display panel in the above embodiments, which is not repeated herein.

In summary, the display panel and the display device provided by the present disclosure at least realize the following beneficial effects.

In the display panel and the display device provided by the present disclosure, the touch layer is provided on a side of the display layer. The touch layer includes a plurality of touch electrodes insulated from each other. The display layer includes a plurality of pixel openings. The orthographic projections of the metal grids in the touch electrodes on the plane where the display panel are at peripheries of the orthographic projections of the pixel openings on the plane where the display panel is located. Adjacent touch electrodes are insulated by disconnections of the disconnected part. The pixel openings include the first color pixel openings and the second color pixel openings. The area of the second color pixel opening is smaller than the area of the first color pixel opening. Human eyes are more sensitive to second color light. If the disconnected parts are arranged around the second color pixel openings, light emitted by the second color subpixels is more likely to leak light through the disconnected parts and cause the problem of visible metal grids. When the disconnected parts are provided between adjacent touch electrodes, in the embodiments of the present disclosure, the disconnected parts are arranged to avoid the second color pixel openings as much as possible. An amount of light emitted by the second color subpixels is reduced through the disconnected parts, which is conducive to reducing or avoiding the phenomena of visible metal grids at a large viewing angle and improving display effects of the display panel and display device.

Although specific embodiments of the present disclosure have been described in detail by way of examples, a person skilled in the art should understand that the above embodiments are for illustration only, rather than limiting the scope of the present disclosure. A person skilled in the art can make modifications without departing from the scope and spirit of the present disclosure. The scope of the present disclosure is defined by the appended claims.

What is claimed is:

1. A display panel, comprising a display layer and a touch layer arranged on a side of the display layer, wherein:

the display layer includes a plurality of subpixels and a plurality of pixel openings, the plurality of subpixels includes first color subpixels and second color subpixels, the plurality of pixel openings includes first color pixel openings and second color pixel openings, a first color subpixel corresponds to a first color pixel opening, a second color subpixel corresponds to a second color pixel opening, and an area of the first color pixel opening is larger than an area of the second color pixel opening, wherein the first color pixel opening is one of a red or blue pixel opening and the second color pixel opening is a green pixel opening;

the touch layer includes a plurality of touch electrodes insulated from each other, the plurality of touch electrodes includes a plurality of electrically connected metal grids, and orthographic projections of the plurality of metal grids on a plane where the display panel is located are at peripheries of orthographic projections of the plurality of pixel openings on the plane where the display panel is located;

disconnected parts are arranged between at least part of adjacent touch electrodes;

the second color pixel openings include a plurality of first pixel openings arranged along a first direction, a first pixel opening of the plurality of first pixel openings includes a first edge and a second edge opposite along a second direction, and the first direction intersects the second direction, wherein the first pixel opening is a green pixel opening; and the first edges and the second edges are linear edges, an area between a line where the first edges are located and a line where the second edges are located is a first area, and the disconnected parts avoid the first area; or the first edges and the second edges are arc edges, a first tangent of the first edges and a second tangent of the second edges are parallel to the first direction, an area between the first tangent line and the second tangent line is a first area, and the disconnected parts avoid the first area.

2. The display panel according to claim 1, wherein:

the plurality of subpixels further includes third color subpixels, and the plurality of pixel openings further includes third color pixel openings, and a third color subpixel corresponds to a third color pixel opening;

an area of the third color pixel opening is smaller than an area of the first color pixel opening, and greater than or equal to an area of the second color pixel opening; and along an extending direction of the first area, the disconnected parts do not overlap the third color pixel openings.

3. The display panel according to claim 1, wherein:

among adjacent touch electrodes, one touch electrode includes a first line segment, and the other touch electrode includes a second line segment, a surface of the first line segment facing the second line segment is a first end face, a surface of the second line segment facing the first line segment is a second end face, and a disconnected part is between the first end face and the second end face.

4. The display panel according to claim 3, wherein an orthographic projection of the first end face on the plane where the display panel is located is a first straight line segment, an orthographic projection of the second end face on the plane where the display panel is located is a second straight line segment, the first straight line segment is parallel to the second straight line segment, and is perpendicular to an extending direction of the first line segment.

5. The display panel according to claim 4, wherein along the extending direction of the first line segment, a minimum distance between a disconnected part and an edge of an orthographic projection of a second color pixel opening on the plane where the display panel is located is S1, and S1≥5.9 μm.

6. The display panel according to claim 3, wherein an orthographic projection of the first end face on the plane where the display panel is located is a first straight line segment, an orthographic projection of the second end face on the plane where the display panel is located is a second straight line segment, the first straight line segment is parallel to the second straight line segment, and the first straight line segment intersects an extending direction of the first line segment at an angle that is not perpendicular.

7. The display panel according to claim 6, wherein:

orthographic projections of the first line segment and the second line segment on the plane where the display panel is located are adjacent to an orthographic projection of a second color pixel opening on the plane where the display panel is located;

along an extending direction of the first line segment, the first straight line segment is located between the second straight line segment and the second color pixel opening;

the first straight line segment includes a first end portion and a second end portion that are oppositely arranged, and along the extending direction of the first line segment, the first end is between the second end and the second color pixel opening; and along an arrangement direction of the first line segment and the second color pixel opening, the second end is between the first end portion and the second color pixel opening.

8. The display panel according to claim 3, wherein:

the first end face includes a first subsurface and a second subsurface that are connected;

the second end face includes a third subsurface and a fourth subsurface that are connected; and the first subsurface is opposite to the third subsurface, and the second subsurface is opposite to the fourth subsurface.

9. The display panel according to claim 8, wherein a plane where the first subsurface is located intersects a plane where the second subsurface is located, a plane where the third subsurface is located intersects a plane where the fourth subsurface is located, the first subsurface is parallel to the third subsurface, or the second subsurface is parallel to the fourth subsurface.

10. The display panel according to claim 8, wherein the first end face also includes a fifth subsurface connected to the second subsurface, the second end face further includes a sixth subsurface connected to the fourth subsurface, and the fifth subsurface is opposite to the sixth subsurface.

11. The display panel according to claim 10, wherein:

a length of a line segment corresponding to an orthographic projection of the second subsurface on the plane where the display panel is located is greater than a length of a line segment corresponding to an orthographic projection of the first subsurface or the fifth subsurface on the plane where the display panel is located; and a length of a line segment corresponding to the orthographic projection of the fourth subsurface on the plane where the display panel is located is greater than a length of a line segment corresponding to an orthographic projection of the third subsurface or the sixth subsurface on the plane where the display panel is located.

12. The display panel according to claim 3, wherein the first end face includes a first arc-shaped surface, the second end face includes a second arc-shaped surface, the first arc-shaped surface includes a first protrusion, the second arc-shaped surface includes a second recess, and the shapes of the first protrusion and the second recess are fitted.

13. The display panel according to claim 1, comprising first pixel columns and second pixel columns arranged alternately along the second direction, wherein:

a first pixel column includes a plurality of second color subpixels and third color subpixels arranged alternately along the first direction;

a second pixel column includes a plurality of first color subpixels arranged along the first direction; and the first direction is a column direction, and the second direction is a row direction.

14. The display panel according to claim 13, wherein a metal grid of the plurality of mesh grids includes first metal line segments and second metal line segments, the first metal line segments extend along the first direction, and the second metal line segments extend along the second direction.

15. The display panel according to claim 1, comprising a plurality of pixel column units arranged along a third direction, wherein:

the plurality of pixel column units includes first pixel columns, second pixel columns and third pixel columns arranged in sequence along the third direction, a first pixel column of the first pixel columns includes a plurality of first color subpixels arranged along the fourth direction, a second pixel column of the second pixel columns includes a plurality of second color subpixels arranged along the fourth direction, and a third pixel column of the third pixel columns includes a plurality of third color subpixels arranged along the fourth direction;

the third direction intersects the first direction, the second direction and the fourth direction, and the fourth direction intersects both the first direction and the second direction; and in a same pixel column unit, the first color subpixels and the third color subpixels are in a same row along the third direction, and the second color subpixels of the are in another row.

16. The display panel according to claim 15, wherein the metal grid includes first metal line segments and second metal line segments, the first metal line segments extend along the second direction, and the second metal line segments extend along the first direction.

17. The display panel according to claim 15, wherein the metal grid includes curved line segments.

18. A display device, comprising a display panel comprising a display layer and a touch layer arranged on a side of the display layer, wherein:

the display layer includes a plurality of subpixels and a plurality of pixel openings, the plurality of subpixels includes first color subpixels and second color subpixels, the plurality of pixel openings includes first color pixel openings and second color pixel openings, a first color subpixel corresponds to a first color pixel opening, a second color subpixel corresponds to a second color pixel opening, and an area of the first color pixel opening is larger than an area of the second color pixel opening, wherein the first color pixel opening is one of a red or blue pixel opening and the second color pixel opening is a green pixel opening;

the touch layer includes a plurality of touch electrodes insulated from each other, the plurality of touch electrodes includes a plurality of electrically connected metal grids, and orthographic projections of the plurality of metal grids on a plane where the display panel is located are at peripheries of orthographic projections of the plurality of pixel openings on the plane where the display panel is located;

disconnected parts are arranged between at least part of adjacent touch electrodes;

the second color pixel openings include a plurality of first pixel openings arranged along a first direction, a first pixel opening of the plurality of first pixel openings includes a first edge and a second edge opposite along a second direction, and the first direction intersects the second direction, wherein the first pixel opening is a green pixel opening; and the first edges and the second edges are linear edges, an area between a line where the first edges are located and a line where the second edges are located is a first area, and the disconnected parts avoid the first area; or the first edges and the second edges are arc edges, a first tangent of the first edges and a second tangent of the second edges are parallel to the first direction, an area between the first tangent line and the second tangent line is a first area, and the disconnected parts avoid the first area.

* * * * *